(12) United States Patent
Coffman

(10) Patent No.: US 6,514,881 B1
(45) Date of Patent: Feb. 4, 2003

(54) HYBRID POROUS LOW-K DIELECTRICS FOR INTEGRATED CIRCUITS

(75) Inventor: Phillip R. Coffman, Rowlett, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/839,724

(22) Filed: Apr. 20, 2001

Related U.S. Application Data

(60) Provisional application No. 60/206,403, filed on May 23, 2000.

(51) Int. Cl.[7] .................. H01L 21/31; H01L 21/469; H01L 21/324; H01L 21/477
(52) U.S. Cl. .................. 438/780; 438/759; 438/761; 438/763; 438/781; 438/789; 438/790; 427/243
(58) Field of Search ................ 438/99, 404, 400, 438/407, 408, 409, 435, 437, 440, 623, 624, 759, 761, 763, 778, 780, 781, 790, 793, 794; 427/358, 376.1, 397.1, 447, 485, 243, 487, 489, 343, 344, 373, 387; 257/40, 386, 395, 506

(56) References Cited

U.S. PATENT DOCUMENTS 6,171,945 B1 * 1/2001 Mandal et al. .............. 438/622
6,194,029 B1 * 2/2001 Aoi .............................. 427/243
6,214,748 B1 * 4/2001 Kobayashi et al. ......... 438/782

OTHER PUBLICATIONS

Wolf et al., Silicon processing for the VLSI Era, vol. 1, Lattice Press pp. 184–185.*

Coffman, "Synthesis, Processing, and Characterization of Several Group IV, V and VI Nitrides and Related Compounds," Arizona State University, Dec. 1996.

* cited by examiner

*Primary Examiner*—Olik Chaudhuri
*Assistant Examiner*—Julio J. Maldonado
(74) *Attorney, Agent, or Firm*—Jacqueline J. Garner; W. James Brady, III; Frederick J. Telecky, Jr.

(57) ABSTRACT

An organically modified dielectric network structure (208) and solid halide-containing material (206) are co-deposited using a chemical vapor deposition process. The solid halide-containing material (206) is then sublimated leaving a porous dielectric (212). An encapsulating layer (210) is formed over the porous dielectric (212) to seal any remaining halide-containing material within the porous dielectric (212).

24 Claims, 3 Drawing Sheets

HYBRID POROUS LOW-K DIELECTRICS FOR INTEGRATED CIRCUITS

This application claims priority under 35 USC §119(e)(1) of provisional application No. 60/206,403 filed May 23, 2000.

FIELD OF THE INVENTION

The invention is generally related to the field of pre- and inter-metal dielectric films used in integrated circuits and more specifically to porous low-k dielectric films.

BACKGROUND OF THE INVENTION

As integrated circuits become more and more dense, the RC delay factor associated with the interconnect layers becomes more critical. One method for improving the RC delay factor is to reduce the capacitance between metal lines. (This include both metal lines in the same metal interconnect layer and metal lines in adjacent metal interconnect layers.) For this reason, a great deal of work has been done on developing new low dielectric constant (low-K) materials for use in pre-metal, inter-metal, and intra-metal dielectrics.

One class of materials being investigated is spin-on dielectrics. Spin-on dielectrics include such materials as hydrogen silsesquioxane (HSQ) and fluorinated silicon dioxide (FSG). Unfortunately, many spin-on dielectrics involve the use of solvents that may leave a residual contamination and pose environmental waste issues.

Another class of materials being investigated is called porous dielectrics. Porous dielectrics typically have a stiff inorganic structure with air holes to reduce the overall dielectric constant. Unfortunately, to date, these films have been friable and lack the mechanical toughness to survive the subsequent chemical mechanical planarization process now being used in many interconnect fabrication sequences.

SUMMARY OF THE INVENTION

The invention is a method for forming a porous dielectric film using a halide and an organic modifier. An organically modified dielectric network structure and solid halide-containing material is co-deposited using a chemical vapor deposition process. The solid halide-containing material is then sublimated leaving a porous dielectric.

An advantage of the invention is providing a porous low-k film that is easily fabricated and has the mechanical toughness to withstand subsequent processing.

This and other advantages will be apparent to those of ordinary skill in the art having reference to the specification in conjunction with the drawings.

DETAILED DESCRIPTION OF THE EMBODIMENTS

The invention will now be described in conjunction with a subtractive metal-etch process and then with a damascene metal process. It will be apparent to those of ordinary skill in the art that the benefits of the invention may be applied to other damascene metal and subtractive-etch processes as well.

Figure 1:
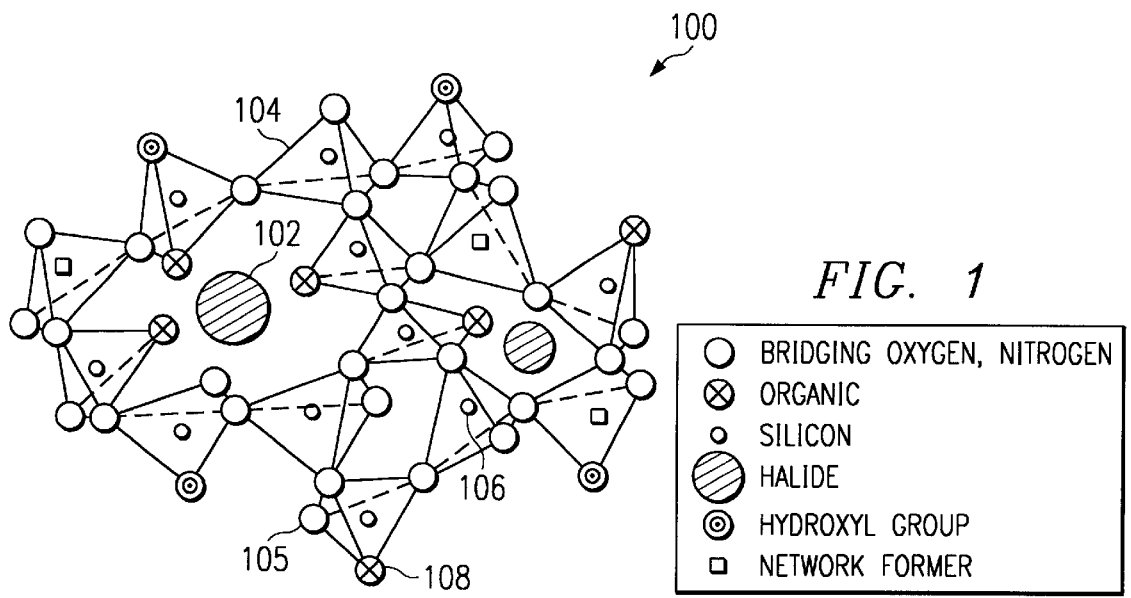
FIG. 1 is a diagram of an organically modified dielectric structure with embedded halide-containing material according to the invention.

To accomplish the invention, an organically modified dielectric network structure is co-deposited with a solid halide-containing material. FIG. 1 illustrates the resulting structure 100. The structure 100 contains halide-containing material 102 embedded within a modified dielectric network 104. The modified dielectric network 104 comprises inorganic dielectric elements (105, 106) combined with an organic modifier 108. Additional elements, such as the hydroxyl group and a network former, may also be included as shown. The network former may, for example, comprise phosphorous or boron if the structure is to be used as a pre-metal dielectric. A hydroxyl group may be present as a defect.

The modified dielectric network structure comprises an inorganic network structure. For example, silicon-oxide, silicon-nitride, or silicon-oxynitride may be used. Other examples, such as germanium-oxide, germanium-nitride, or germanium-oxynitride, will be apparent to those of ordinary skill in the art. The inorganic network structure is modified by an organic. The organic provides a more polymer-like structure. The polymer-like structure provides more desirable mechanical properties without losing the desirable thermal properties of an inorganic network.

In the preferred embodiment, the halide comprises chloride such as ammonium chloride due to its high sublimation temperature. However, other halides may alternatively be used. For example, while fluoride has a lower sublimation temperature, it has the advantage of a low dielectric constant for the film should any residual fluoride remain in the final structure. Bromine and iodine may work, but these are currently too costly and have less volatile precursors.

Figure 2:
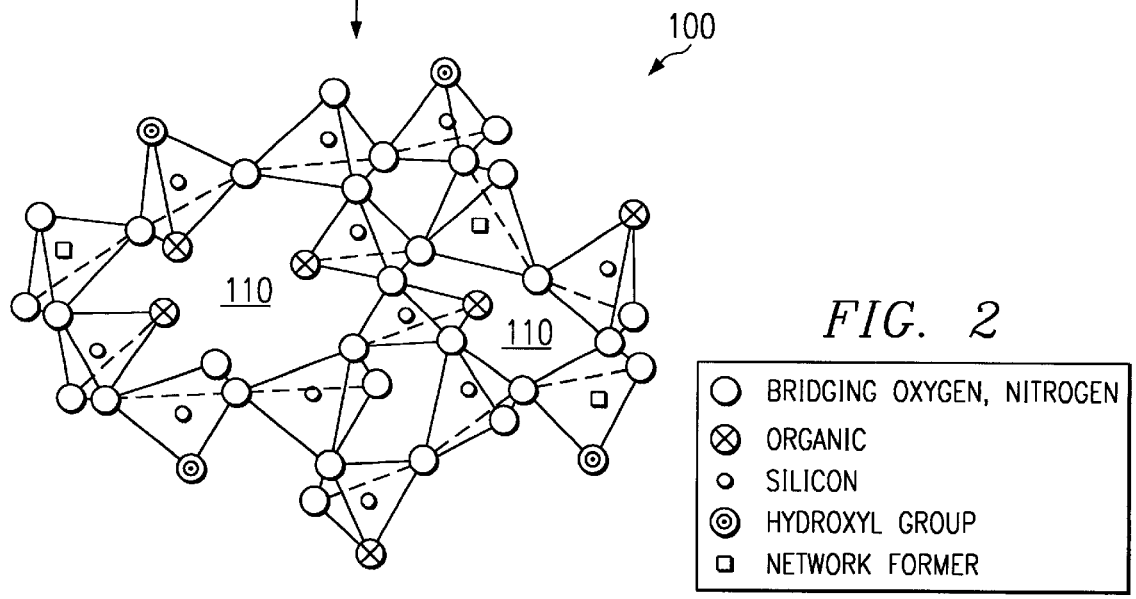
FIG. 2 is a diagram of the organically modified dielectric structure of FIG. 1 after the embedded halide-containing material has been vaporized.

The halide-containing material is sublimated as shown in FIG. 2. After sublimation, structure 100 becomes porous or more porous due to the space 110 left by the halide-containing material. Sublimation may be carried out under vacuum at a temperature less than 400° C. for ammonium chloride. Although undesirable, some halide-containing material may remain after sublimation.

Figure 3A:
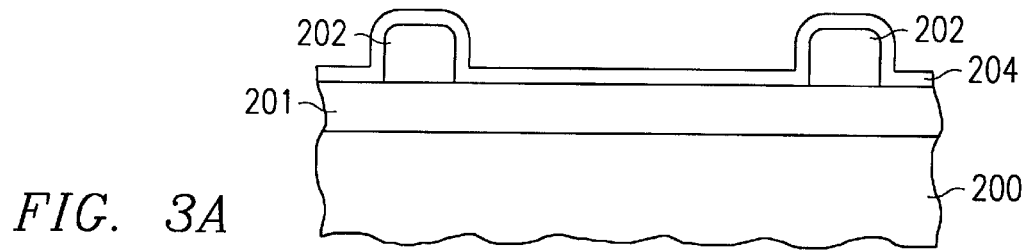
FIGS. 3A–3D are cross-sectional diagrams of a hybrid low-K dielectric layer of the invention at various stages of subtractive metal-etch fabrication.

A method for forming the hybrid porous low-k dielectric in a subtractive metal-etch process accordingly to the invention will now be discussed with reference to FIGS. 3A–3D. Referring to FIG. 3A, a thin layer 204 of a dense dielectric is deposited over the surface of semiconductor body 200. Semiconductor body 200 will typically have been processed through the formation of isolation structures and transistors (not shown). As shown, semiconductor body 200 has also been processed through the formation of the premetal dielectric 201 and at least one metal interconnect layer 202. As the invention may be applied to premetal, intrametal, or intermetal dielectrics, semiconductor body 200 may have been processed through none, one, or more interconnect layers prior to the deposition of thin dielectric layer 204. Thin dielectric layer 204 comprises a PECVD (plasma enhanced chemical vapor deposition) silicon nitride in the preferred embodiment. Alternatives, such as a PETEOS (plasma enhanced tetraethyoxysilane) will be apparent to those of ordinary skill in the art. Thin dielectric layer 204 may have a thickness in the range of 200–500 Å.

Next, source fluids are applied to a CVD (chemical vapor deposition) chamber. As an example, thermal CVD may be used for a subtractive metal etch technology (such as that shown in FIG. 3A). Alternatively, PECVD may be used for a damascene type technology (such as those used for copper interconnects). Various source gases may be used to practice the invention. The source fluids chosen need to supply a source for an inorganic dielectric network (e.g., Si or Ge and O and/or N), a source for an organic, and a source for a halide. Helium may be added for Penning dissociation in a plasma. For example, a partially chlorinated silicon feedstock gas or liquid may be combined with ammonia and a small amount of organic. Helium may be added as a diluent and for Penning dissociation. Oxygen or nitrous oxide may be added to form Si—O—Si bonds to lower the dielectric constant. The partially chlorinated silicon feedstock may, for example, comprise $SiH_2Cl_2$, $SiHCl_3$ or $SiCl_4$. The organic may, for example, comprise methane, ethylene, propene, or 1,3 butadiene. It will be apparent to those of ordinary skill in the art that one source fluid may be used as a source for more than one of the above. For example, the partially chlorinated silicon feed stock above is a source for silicon and chloride (halide), an organosilane (a silicon feedstock with organic ligands) may be used for the silicon and organic source, or a chlorinated organic molecule such as dichloroethylene, may be used for the halide and organic.

Figure 3B:
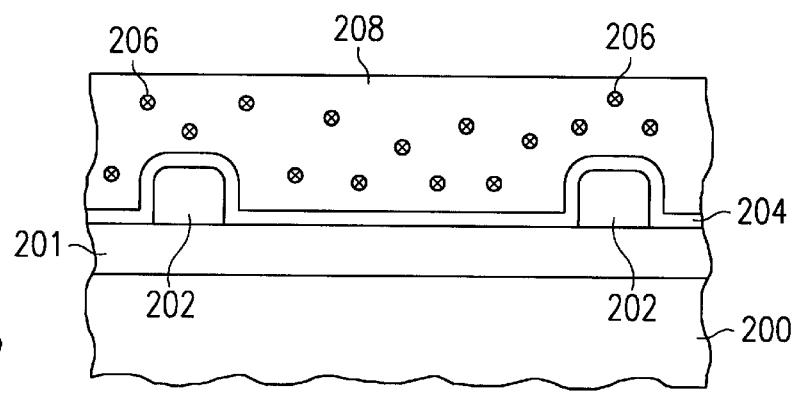

The appropriate source fluids, as described above, are provided at a relatively low temperature to ensure the formation of a solid halide-containing material 206 within the dielectric structure 208, as shown in FIG. 3B. The temperature should remain below the vaporization temperature of the solid halide-containing material. The size of solid halide containing material 206 is enlarged in FIG. 3B for illustration purposes. The actual relative size would be significantly smaller. The thickness of dielectric structure 208 may be in the range of 7000–17000 Å.

The resulting dielectric structure 208 comprises a network structure (Si—N—Si, Si—NH—Si, Si—O—Si, etc) with a small amount of organic bound to the network. The solid halide-containing material is ammonium chloride ($NH_4Cl$).

If dielectric structure 208 is to be used as a premetal dielectric, dopants can be incorporated as well. For example, boron and/or phosphorous may be incorporated into dielectric structure 208.

Figure 3C:
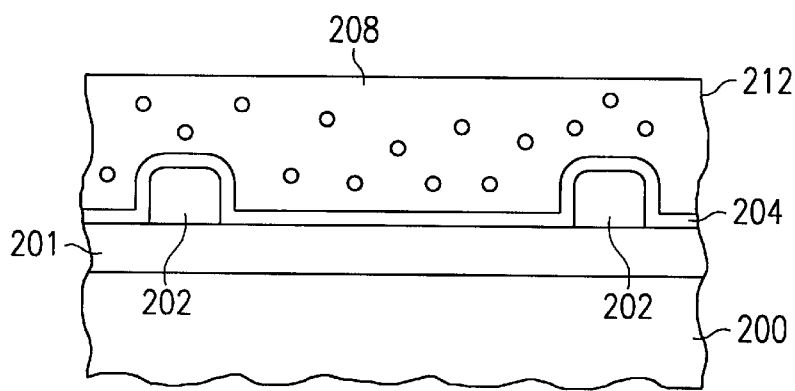

Referring to FIG. 3C, the solid halide-containing material 206 is vaporized (sublimed) using low pressure and elevated temperature (i.e., above room temperature) leaving a porous dielectric 212. Preferably, a chamber separate from the deposition chamber is used. Either a dedicated chamber on the deposition tool or a low pressure furnace may be used. Ammonium chloride may be sublimed under vacuum and at a temperature less than 400° C. (e.g., 350° C. at atmospheric pressure). The sublimation temperature varies according to the halide used. In addition, the required temperature may be lowered by lowering the pressure. The temperature should remain less than 400° C. and the pressure may be between 10 mTorr and 100 Torr.

The vaporization may be followed by a metal anneal or the vaporization may be combined with the metal anneal. Hydrogen may be added during the metal anneal if desired.

Figure 3D:
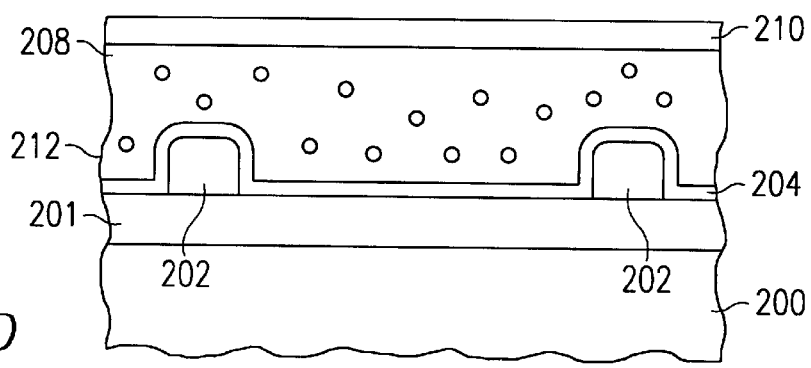

After vaporization, an encapsulating dielectric layer 210 may be deposited over the porous dielectric 212, as shown in FIG. 3D. In the preferred embodiment, the encapsulating dielectric layer 210 comprises silicon nitride or silicon dioxide. The thickness of the encapsulating dielectric layer 210 may be in the range of 200–500 Å. The encapsulating layer 210 is used to prevent any possible metal corrosion from any remaining halide-containing material. Ammonium chloride, for example, is a solid electrolyte that can enhance metal corrosion.

The invention described above may be incorporated into a process flow in a number of ways. In one embodiment, after the dielectric network structure 208 and halide-containing material are co-deposited, the structure is chemically-mechanically polished (CMP'd). Then, the halide-containing material is sublimated. After sublimation, the encapsulating layer 210 is formed. Then, vias for the next metal interconnect layer may be etched. The barrier metal for the next interconnect layer is relied on to protect the metal layer from any remaining halide-containing material.

If desired, a second sublimation through micro-vents in the vias may be accomplished before any barrier metals are deposited. The second sublimation reduces any halide residue around the via. The disadvantage is that it is an additional step and with the open vias, could collect yield killing particles.

In another embodiment, after the dielectric network structure 208 and halide-containing material 206 are co-deposited, the halide-containing material is sublimated. Then, a thick capping layer may be used in place of encapsulating dielectric layer 210. The thick capping layer has the disadvantage of requiring additional time and money versus a thin encapsulating layer. The thick capping layer is then CMP'd down to approximately 500 Å. After CMP, the vias for the next metal interconnect layer may be etched.

In yet another embodiment, after the dielectric network structure 208 and halide-containing material are co-deposited, the structure is CMP'd. After CMP, the vias are etched for the next metal interconnect layer. After via etch, the halide-containing material is sublimated. After sublimation, the encapsulating layer 210 is formed. A very conformal CVD deposition is required for this step. The encapsulating layer 210 is then removed from the bottom of the vias.

Figure 4A:
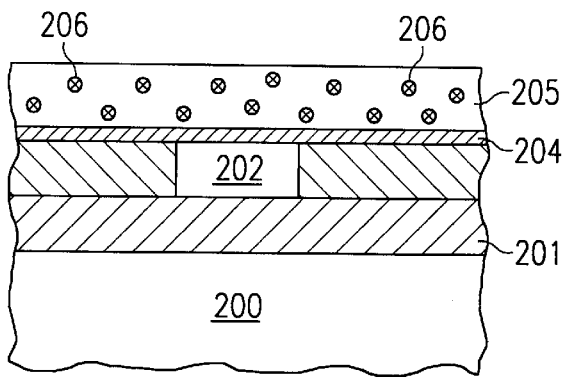
FIGS. 4A–4F are cross-sectional diagrams of a hybrid low-k dielectric layer of the invention at various stages of a damascene fabrication.

A method for forming the hybrid porous low-k dielectric in a damascene metal process accordingly to the invention will now be discussed with reference to FIGS. 4A–4C. Referring to FIG. 4A, a thin layer 204 of a dense dielectric is deposited over the surface of semiconductor body 200. Semiconductor body 200 will typically have been processed through the formation of isolation structures and transistors (not shown). As shown, semiconductor body 200 has also been processed through the formation of the premetal dielectric 201 and at least one metal interconnect layer 202. As the invention may be applied to premetal, intrametal, or intermetal dielectrics, semiconductor body 200 may have been processed through none, one, or more interconnect layers prior to the deposition of thin dielectric layer 204. Thin dielectric layer 204 comprises a PECVD (plasma enhanced chemical vapor deposition) silicon nitride in the preferred embodiment. Alternatives, such as a silicon carbide will be apparent to those of ordinary skill in the art. Thin dielectric layer 204 may have a thickness in the range of 200–500 Å.

Next, source fluids are applied to a CVD (chemical vapor deposition) chamber. PECVD may be used for a damascene type technology (such as those used for copper interconnects). Various source gases may be used to practice the invention. The source fluids chosen need to supply a source for an inorganic dielectric network (e.g., Si or Ge and O and/or N), a source for an organic, and a source for a halide. Helium may be added for Penning dissociation in a plasma. For example, a partially chlorinated silicon feedstock gas or liquid may be combined with ammonia and a small amount of organic. Helium may be added as a diluent and for Penning dissociation. Oxygen or nitrous oxide may be added to form Si—O—Si bonds to lower the dielectric constant. The partially chlorinated silicon feedstock may, for example, comprise $SiH_2Cl_2$, $SiHCl_3$ or $SiCl_4$. The organic may, for example, comprise methane, ethylene, propene, or 1,3 butadiene. It will be apparent to those of ordinary skill in the art that one source fluid may be used as a source for more than one of the above. For example, the partially chlorinated silicon feed stock above is a source for silicon and chloride (halide), an organosilane (a silicon feedstock with organic ligands) may be used for the silicon and organic source, or a chlorinated organic molecule such as dichloroethylene, may be used for the halide and organic.

The appropriate source fluids, as described above, are provided at a relatively low temperature to ensure the formation of a solid halide-containing material 206 within the dielectric structure 208, as shown in FIG. 4A. The temperature should remain below the vaporization temperature of the solid halide-containing material. The size of solid halide containing material 206 is enlarged in FIG. 4A for illustration purposes. The actual relative size would be significantly smaller. The thickness of dielectric structure 208 may be in the range of 7000–17000 Å.

The preferred embodiment uses PECVD with the following parameters:

|          |                  |
|----------|------------------|
| $SiH_2Cl_2$ | 30–150 sccm   |
| $CH_4$   | 10–50 sccm       |
| $NH_3$   | 100–500 sccm     |
| $N_2O/O_2$ | 10–50 sccm     |
| Pressure | 0.5–9.0 Torr     |
| Power    | 1.0–1.75 W/cm$^2$ |
| Temp.    | ~300° C.         |

The resulting dielectric structure 208 comprises a network structure (Si—N—Si, Si—NH—Si, Si—O—Si, etc) with a small amount of organic bound to the network. The solid halide-containing material is ammonium chloride ($NH_4Cl$).

If dielectric structure 208 is to be used as a premetal dielectric, dopants can be incorporated as well. For example, boron and/or phosphorous may be incorporated into dielectric structure 208.

Figure 4B:
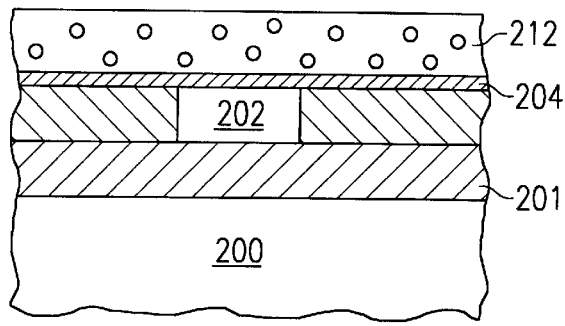

Referring to FIG. 4B, the solid halide-containing material 206 is vaporized (sublimed) using low pressure and elevated temperature (i.e., above room temperature) leaving a porous dielectric 212. Preferably, a chamber separate from the deposition chamber is used. Either a dedicated chamber on the deposition tool or a low pressure furnace may be used. Ammonium chloride may be sublimed under vacuum and at a temperature less than 400° C. (e.g., 350° C. at atmospheric pressure). The sublimation temperature varies according to the halide used. In addition, the required temperature may be lowered by lowering the pressure. The temperature should remain less than 400° C. and the pressure may be between 10 mTorr and 100 Torr.

Figure 4C:
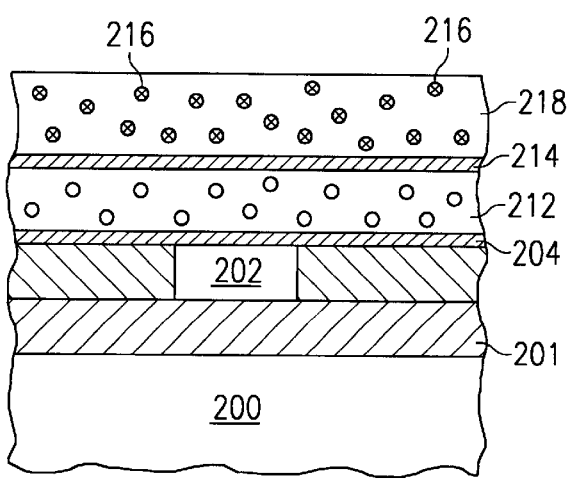

After vaporization, an etchstop layer 214 may be deposited over the porous dielectric 212, as shown in FIG. 4C. In the preferred embodiment, the etchstop layer 214 comprises silicon nitride or silicon carbide. The thickness of the etchstop layer 214 may be in the range of 200–500 Å. The etchstop layer 214 is used as an etchstop for the subsequent trench etch.

Using the process described above, a second dielectric structure 218 with embedded solid halide containing material 216 is deposited over etchstop layer 214. The solid halide containing material 216 is then vaporization as shown in FIG. 4D to form porous dielectric 222.

Figure 4D:
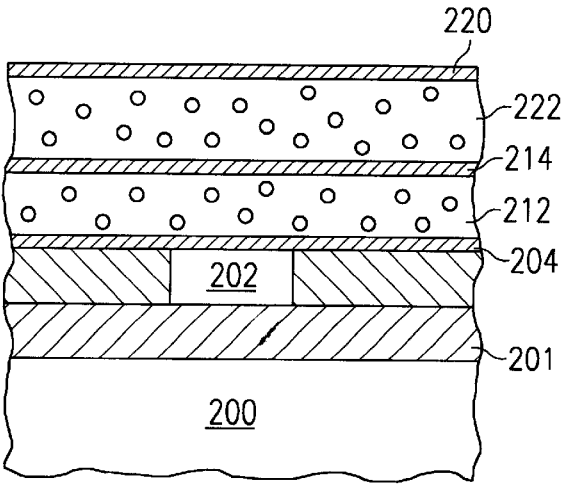
Figure 4E:
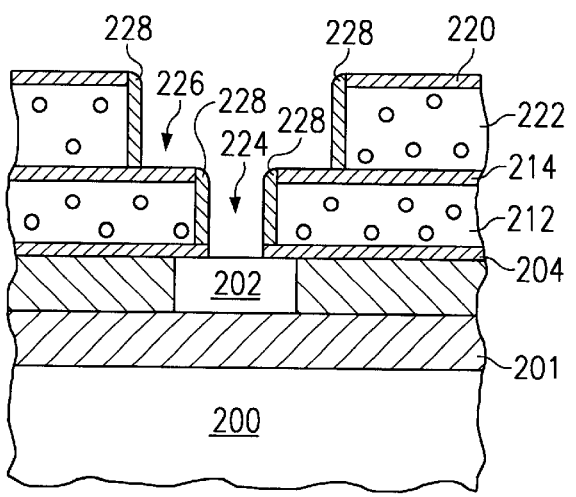

After vaporization, an encapsulating dielectric layer 220 may be deposited over the porous dielectric 222, as shown in FIG. 4D. In the preferred embodiment, the encapsulating dielectric layer 210 comprises silicon nitride, silicon carbide or silicon dioxide. The thickness of the encapsulating dielectric layer 220 may be in the range of 200–500 Å. The encapsulating layer 220 is used to minimize metal corrosion from any remaining halide-containing material. Ammonium chloride, for example, is a solid electrolyte that can enhance metal corrosion.

Next, trench 226 is etched through layers 220 and 222 using layer 214 as an etchstop and via 224 is etched through layers 220, 222, 214, and 212. If desired, a second encapsulating layer 228 may then be conformally deposited and anisotropically etched back to encapsulate the trench 226 and via 224 sidewalls. Alternatively, the barrier metal of the subsequent metal interconnect may be relied on to protect the metal from contamination.

In the preferred embodiment, layer 204 comprises silicon dioxide and layer 214 and 220 comprise silicon nitride or silicon carbide. In this case, the portion of layer 204 at the bottom of via 224 can be removed after encapsulating the sidewalls of trench 226 and via 224. In this manner, metal interconnect 202 remains protected as long as possible.

Figure 4F:
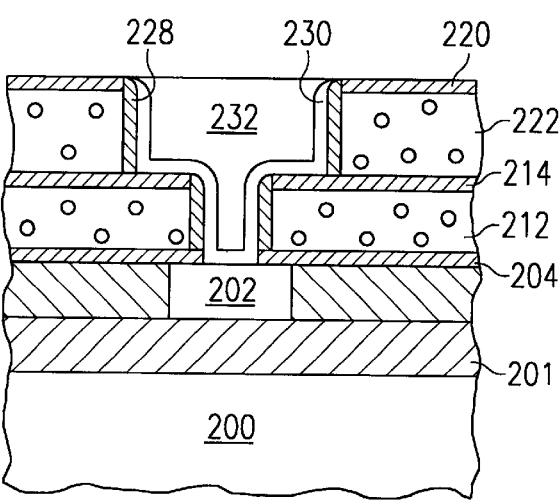

Finally, barrier layer 230 and copper interconnect 232 are deposited and chemically-mechanically polished back, as shown in FIG. 4F. The damascene approach has the advantage of having a more planar surface on which to form the porous dielectric.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a dielectric layer in an integrated circuit, comprising the steps of:

forming a first dielectric layer over a semiconductor body;

co-depositing a dielectric network structure and a halide-containing material over said first dielectric layer, wherein said dielectric network structure comprises an organic modifier and wherein said halide-containing material comprises $NH_4X$, where X is a halide;

vaporizing and evacuating at least a portion of said halide containing material from said dielectric network structure to form a porous dielectric layer;

forming a second dielectric layer over said porous dielectric layer.

2. The method of claim 1, wherein said first dielectric layer comprises a PETEOS material.

3. The method of claim 1, wherein said co-depositing step comprises the steps of:

placing said semiconductor body in a chemical-vapor deposition (CVD) chamber;

supplying a plurality of source fluids to said CVD chamber, wherein said plurality of source fluids provide a source for an inorganic dielectric network structure, a source for a halide and an organic source; and heating said CVD chamber to a temperature less than a vaporization temperature of said halide-containing material.

4. The method of claim 3, wherein said plurality of source fluids further provides a source of helium.

5. The method of claim 3, wherein said plurality of source fluids further provides a source of oxygen.

6. The method of claim 3, wherein said source for an inorganic dielectric structure comprises a source for silicon and a source for nitrogen.

7. The method of claim 3, wherein said plurality of source fluids comprises a partially chlorinated silicon feedstock, ammonia, and an organic co-reactant.

8. The method of claim 7, wherein said plurality of source fluids further comprises $N_2O$.

9. The method of claim 7, wherein said plurality of source fluids further comprises $O_2$.

10. The method of claim 3, wherein said plurality of source fluids comprises a partially chlorinated silicon feedstock with organic ligands and ammonia.

11. The method of claim 3, wherein said CVD chamber is a PECVD chamber.

12. The method of claim 1, wherein said vaporization step occurs at a temperature of less than 400° C. and a pressure in the range of 10 mTorr to 100 Torr.

13. The method of claim 3, wherein said step of supplying a plurality of source fluids comprises the steps of flowing $SiH_2Cl_2$ at 30–150 sccm, flowing $CH_4$ at 10–50 sccm, flowing $NH_3$ at 100–500 sccm, and flowing $N_2O/O_2$ at 10–50 sccm; and wherein said heating step heats said CVD chamber to a temperature on the order of 300° C.; and further comprising the steps of:
   pressurizing said CVD chamber to a pressure in the range of 0.5–9.0 Torr and
   providing a plasma power in the range of 1.0–1.75 $W/cm^2$.

14. A method for forming a dielectric layer in an integrated circuit, comprising the steps of:
   forming a first dielectric layer over a semiconductor body;
   forming a porous dielectric layer over said first dielectric layer by:
      placing said semiconductor body in a chemical vapor deposition (CVD) chamber at a temperature of less than 400° C.;
      supplying a plurality of source fluids to said CVD chamber, wherein said plurality of source fluids provides a source of silicon, nitrogen, chloride, and organic to form a dielectric network structure having an embedded chloride-containing material;
      chemically-mechanically polishing said dielectric network structure having the embedded chloride-containing material;
      vaporizing and evacuating at least a portion of said chloride-containing material from said dielectric network structure at a temperature of less than 400° C. and a pressure in the range of 10 mTorr to 100 Torr after said chemically-mechanically polishing step; and
   forming a second dielectric layer over said porous dielectric layer.

15. The method of claim 14, wherein said plurality of source fluids further provides a source of helium.

16. The method of claim 3, wherein said plurality of source fluids comprises a partially chlorinated silicon feedstock, ammonia, and an organic co-reactant.

17. The method of claim 16, wherein said plurality of source fluids further comprises $N_2O$.

18. The method of claim 16, wherein said plurality of source fluids further comprises $O_2$.

19. The method of claim 14, wherein said plurality of source fluids comprises a partially chlorinated silicon feedstock with organic ligands and ammonia.

20. The method of claim 14, wherein said first and second dielectric layers comprise silicon nitride.

21. The method of claim 14, wherein said first and second dielectric layers comprise silicon carbide.

22. The method of claim 14, further comprising the steps of:
   etching vias in said second dielectric layer and said porous dielectric layer; and
   vaporizing any remaining halide-containing material through micro-vents in said vias.

23. The method of claim 14, further comprising the steps of etching vias in said dielectric network structure prior to said vaporizing step.

24. A method of fabricating an integrated circuit comprising the steps of:
   forming a first dielectric layer over a semiconductor body;
   forming a first porous dielectric layer over said first dielectric layer by:
      placing said semiconductor body in a chemical vapor deposition (CVD) chamber at a temperature of less than 400° C.;
      supplying a plurality of source fluids to said CVD chamber, wherein said plurality of source fluids provides a source of silicon, nitrogen, chloride, and organic to form a dielectric network structure having an embedded chloride-containing material; and
      vaporizing and evacuating at least a portion of said chloride-containing material from said dielectric network structure at a temperature of less than 400° C. and a pressure in the range of 10 mTorr to 100 Torr; and
   forming a etchstop layer over said porous dielectric layer;
   forming a second porous dielectric layer over the etchstop layer;
   forming a first encapsulating layer over the second porous dielectric layer;
   etching a trench in said first encapsulating layer and the second porous layer;
   etching a via in the etchstop layer and the first porous layer;
   vaporizing any remaining halide-containing material through micro-vents in said via;
   forming a barrier layer in said trench and said via;
   forming a copper interconnect over said barrier layer.

* * * * *